(12) United States Patent
Sakamoto et al.

(10) Patent No.: US 8,969,828 B2
(45) Date of Patent: Mar. 3, 2015

(54) SCANNING ELECTRON MICROSCOPE WITH A TABLE BEING GUIDED BY ROLLING FRICTION ELEMENTS

(75) Inventors: Naoki Sakamoto, Hitachinaka (JP);
Kaname Takahashi, Hitachinaka (JP);
Shigeru Haneda, Hitachinaka (JP);
Shinsuke Kawanishi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/640,560

(22) PCT Filed: May 11, 2011

(86) PCT No.: PCT/JP2011/002608
§ 371 (c)(1),
(2), (4) Date: Oct. 15, 2012

(87) PCT Pub. No.: WO2011/145292
PCT Pub. Date: Nov. 24, 2011

(65) Prior Publication Data
US 2013/0048854 A1 Feb. 28, 2013

(30) Foreign Application Priority Data

May 20, 2010 (JP) ................................. 2010-115889

(51) Int. Cl.
*H01J 37/20* (2006.01)
*H01J 37/28* (2006.01)

(52) U.S. Cl.
CPC ............... *H01J 37/20* (2013.01); *H01J 37/28* (2013.01); *H01J 2237/202* (2013.01); *H01J 2237/20278* (2013.01)

USPC ................. 250/442.11; 250/440.11; 248/562; 248/568; 248/636; 248/346.01

(58) Field of Classification Search
CPC ............ H01J 37/20; H01J 2237/20221; H01J 2237/2007; H01J 2237/20278; H01J 2237/202; H01L 21/68; F16C 29/00; H02K 2201/18; H02K 41/03
USPC ........ 250/440.11, 442.11; 248/562, 568, 636, 248/346.01
See application file for complete search history.

(56) References Cited

U.S. PATENT DOCUMENTS

| 4,590,380 A * | 5/1986 | Tamaki .................... 250/442.11 |
| 5,646,403 A | 7/1997 | Mori et al. |
| 2002/0047243 A1* | 4/2002 | Kato et al. .................... 277/628 |
| 2003/0075412 A1* | 4/2003 | Heiartz et al. ................... 192/20 |

(Continued)

FOREIGN PATENT DOCUMENTS

| JP | 63-052215 A | 3/1988 |
| JP | 8-129985 A | 5/1996 |
| JP | 09-223477 A | 8/1997 |

*Primary Examiner* — Phillip A Johnston
*Assistant Examiner* — Brooke Purinton
(74) *Attorney, Agent, or Firm* — Mattingly & Malur, P.C.

(57) ABSTRACT

This invention stabilizes positioning and provides improved positioning accuracy in a scanning electron microscope provided with stage-driving means utilizing an effect of rolling friction.
In this scanning electron microscope that includes a sample stage equipped with an x-table, a y-table, a z-table, a rotation table, and a tilting table, and moved by means of stepping motors each connected to a ball screw via a coupling, a sliding friction element is disposed at a position close to the ball screw, between the x-table and the y-table and between a tilting base and the x-table.

6 Claims, 8 Drawing Sheets

(56) References Cited

U.S. PATENT DOCUMENTS

| | | | |
|---|---|---|---|
| 2003/0136309 A1* | 7/2003 | Shinozaki et al. | 108/20 |
| 2004/0090741 A1* | 5/2004 | Lee et al. | 361/685 |
| 2005/0139781 A1* | 6/2005 | Hazaki et al. | 250/442.11 |
| 2009/0236547 A1* | 9/2009 | Huang et al. | 250/492.21 |

* cited by examiner

SCANNING ELECTRON MICROSCOPE WITH A TABLE BEING GUIDED BY ROLLING FRICTION ELEMENTS

TECHNICAL FIELD

The present invention relates to a sample-moving stage of a scanning electron microscope.

BACKGROUND ART

In a scanning electron microscope, an object to be observed is usually rested on a sample mount. Then, the sample mount is moved by a sample stage driven by a stepping motor, a piezoelectric element, or the like. Patent Document 1, for example, discloses an invention made for accurately moving a visual field even when a stage has a backlash or a feed screw has a pitch error.

A prior-art scanning electron microscope (SEM) is shown in FIG. 1, details of a sample-moving stage thereof in FIG. 2, a cross-sectional view taken along line A-A in FIG. 2 is shown in FIG. 3, and an external view from a direction of arrows, taken along line B-B in FIG. 2, is shown in FIG. 4. The scanning electron microscope, used to observe a shape of a sample surface, irradiates, through condenser lenses 2 and an objective lens 3, the surface of the sample 6 mounted on the sample-moving stage 5 inside a sample chamber 4, while scanning this sample surface with an electron beam generated by an electron gun 1, and then uses a secondary-electron detector 7 to capture a secondary electron originating from the sample. Reference numbers 9 to 13 in FIG. 1 denote vacuum pumps that create a vacuum in the sample chamber 4, an electron gun chamber 8, and the like. A stage casing 14 is installed on a side of the sample chamber 4, and a z-table 15 is coupled to the stage casing 14 via cross roller bearings 16a and 16b. The z-table 15 is pulled upward by a spring 17, then guided along cross roller guides 16a and 16b, and driven by rotation of a z-stepping motor 18. This makes a male screw of a z-moving shaft 19 and a female screw 64 mounted on the z-table 15, properly act to move the z-table 15 and thus to move the sample 6 in a z-direction. A tilting shaft 21 is mounted at one end of a tilting table 20, and the tilting shaft 21 is pivotally coupled to the z-table 15 via roller bearings 22 and 23. A locking plate 24 is mounted at the other end of the tilting table 20 and pushed by a stage-locking mechanism 25 mounted in the sample chamber 4.

A worm wheel 26a is fitted at an end of the tilting shaft 21, and a worm gear 26b formed to be combined with the worm wheel 26a is supported by ball bearings 27 and 28 and connected to the z-table 15 via bearing housings 29 and 30. The worm wheel 26a and a T-stepping motor 31 that rotates the worm gear 26b are coupled to each other by spline shafts 32a and 32b so as to be able to follow a movement of the z-moving member 15 in the z-direction. Rotation of the T-stepping motor 31 rotates the tilting shaft 21, thus tilts the sample 6, and retains the sample 6 at a fixed tilt angle. An x-table 33 that moves the sample 6 in an x-direction is mounted on the tilting table 20 via a cross roller guide 34. The x-table 33 is driven by a feed action of an x-ball screw 35 and an x-ball screw nut 36. The x-ball screw nut 36 is fixed to the x-table 33. The x-ball screw 35 is supported at both ends thereof by ball bearings 37 and 38, and is connected to the tilting table 20 at bearing housings 39 and 40. The x-ball screw 35 and an x-stepping motor 41 that rotates the x-ball screw 35 are coupled to each other by an x-stage joint 42. The x-stage joint 42 includes one pair of joint portions, 42a and 42b, for angle follow-up, and a telescopic portion 42c for length control with a ball spline.

The x-table 33 drives the x-stepping motor 41 to rotate the x-ball screw 35 via the x-stage joint 42 and feed the x-ball screw nut 36. This feed action moves the x-table 33 in the x-direction, hence moving the sample in the x=direction. A y-table 43 is mounted on the x-table 33 via cross roller guides 44a and 44b. The y-table 43 is driven by a feed action of a y-ball female screw 45 and a y-ball screw nut 46. The y-ball screw nut 46 is fixed to the y-table 43. The y-ball screw 45 is supported at both ends thereof by ball bearings 47 and 48, and is connected to the x-table 33 at bearing housings 49 and 50. A bevel gear 51a is fitted at one end of the y-ball screw 46, and a bevel gear 51b that meshes with the bevel gear 51a is supported by a ball bearing (not shown) and fixed at a bearing housing 53 to the x-table. The bevel gear 51b is coupled to a y-stepping motor 54 that rotates the y-ball screw 45, by a y-stage joint 55.

The y-stage joint 55 includes one pair of joint portions, 55a and 55b, for angle follow-up, and a telescopic portion 55c for length control with a ball spline. The y-table 43 drives the stepping motor 54 to rotate the bevel gears 51a, 51b and the y-ball screw 45 via the y-stage joint 55 and feed the y-ball screw nut 46. This feed action moves the y-table 43 in a y-direction, hence moving the sample in the y-direction. A rotation table 56 has a worm wheel 57a and is pivotally coupled to the y-table 43 by a ball bearing 58. A worm gear 57b is supported at both ends thereof by ball bearings 59 and 60, and is connected to the y-table 43 at bearing housings 61 and 62.

The worm gear 57b is rotated by a DC motor 63. Rotation of the DC motor 63 turns the worm gear 57b and the worm wheel 57a, thus rotating the rotation table 56 and hence the sample. The sample 6 is mounted in bonded form on a sample holder 65, and the sample holder 65 is inserted in and fixed to a holder stage 66 mounted on the rotation table 56. In this form, the sample is fed in the x-, y-, z-directions, rotated, and tilted.

PRIOR ART LITERATURE

Patent Documents

Patent Document 1: JP-1998-129985-A

SUMMARY OF THE INVENTION

Problems to be Solved by the Invention

In the prior art, the stepping motors for driving the x- and y-tables are installed in a stage casing that is placed outside a vacuum region. The x-stage joint and other elements of a motive force transmission system are arranged between an output shaft of the x-stepping motor and the x-ball screw, and this section generates a backlash and torsional deformation. The scanning electron microscope then decreases in response characteristics, particularly during startup or reversing of the x- and y-tables.

For example, for operations with a trackball, it is necessary to turn the ball before an image starts to move. Table driving, that is, moving the image, has therefore decreased in operability. Referring to the y-table, response characteristics of its driving system further including the bevel gears having a backlash decrease even more significantly than those of the x-table driving system, with the result that operational convenience further decreases. The x- and y-tables are guided by cross roller guides and are moved by a feed action of ball screws.

The ball screws and the cross roller guides are element parts that use rolling friction. Since rolling contact is small in friction, these element parts easily move, thus making the movements of the tables slightly unsteady or unsmooth, and resulting in unstable table movements. During image shifting under a high magnification, these slightly unsteady or unsmooth movements become visible, which causes trouble with the operations and destabilizes positioning. The ball screws, by reason of their high feed accuracy, have come to be used instead of ordinary screw-feed means, and have caused no such instability because of screw feed being based on sliding friction. In addition, the tables had formerly been operated by turning respective control knobs by hand, and partly since the tables had been operated by hand at that time, instability associated with these manual operations had lied in an allowable range. However, it has later become necessary to use a trackball or joystick for table operations, and this has enabled subtle positioning, whereas positioning-associated instability has deteriorated operational convenience.

Means for Solving the Problems

The above problems can be solved by using a scanning electron microscope of the present invention. In this scanning electron microscope, a sample-moving stage for moving a sample includes an x-table for moving the sample in an x-direction right-angled to an electron beam, a y-table for moving the sample in a y-direction right-angled to the x-direction as well as to the electron beam, the y-table being mounted above the x-table, a z-table configured to move in a same z-direction as the direction in which the electron beam travels, a rotation table for rotating the sample in a plane parallel to an x-y plane, and a tilting table for imparting a tilting action to the sample. In the scanning electron microscope, the x-table is mounted on the tilting base, the x-table and the y-table are guided by respective rolling friction elements such as cross roller guides, and moved by respective stepping motors each connected to a ball screw via a coupling, and each stepping motor being disposed inside a sample chamber. The electron beam is scanned on the sample surface, thereby allowing a detector to detect a signal originating from the sample, and this signal detected by the detector is used to display an image of the sample. Between the x-table and the y-table and between the tilting base and the x-table, a sliding friction element is disposed near the ball screw.

Effects of the Invention

The stepping motors directly drive the corresponding ball screws that move the tables. Direct driving reduces a backlash of the driving systems, improves response characteristics of the tables, and hence improves operability. The ball screws and cross roller guides that move the tables are rolling elements of small friction, and these elements easily move. For this reason, the rolling elements in the prior art have imparted instability to the movements of tables. In the present invention, however, sliders that are sliding friction elements are arranged in close proximity to the ball screws, between the y-table and the x-table as well as between the x-table and a T-base, and the sliders are each formed into an appropriate shape and structure, so that the scanning electron microscope prevents unstable table movements that the sliding elements might cause. The present invention effectively prevents the table movements from delaying as well as from becoming unstable, and consequently improves operational convenience. Accordingly, subtle positioning with a trackball or a joystick is also stabilized.

MODE FOR CARRYING OUT THE INVENTION

Figure 1:
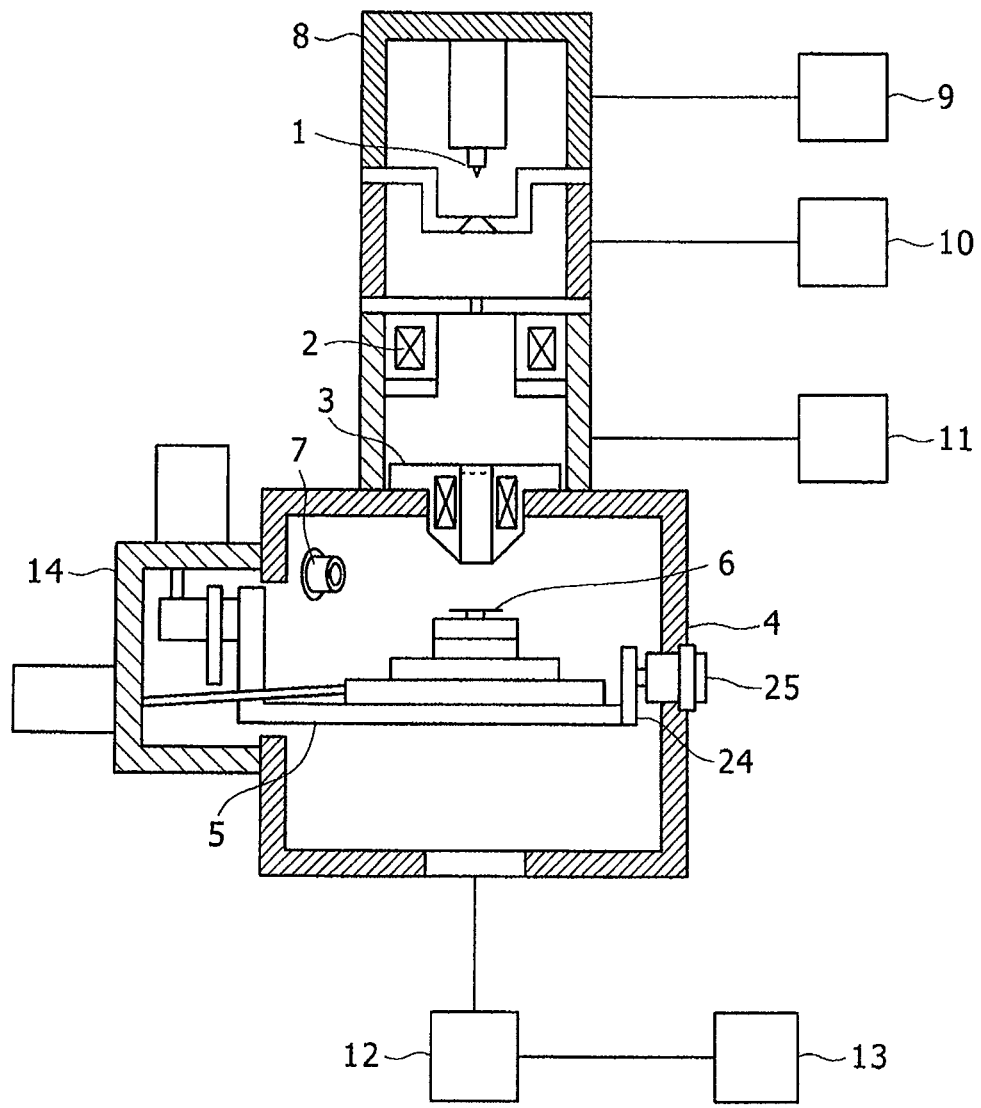
FIG. 1 is a longitudinal cross-sectional side view showing an example of a conventional scanning electron microscope.
Figure 2:
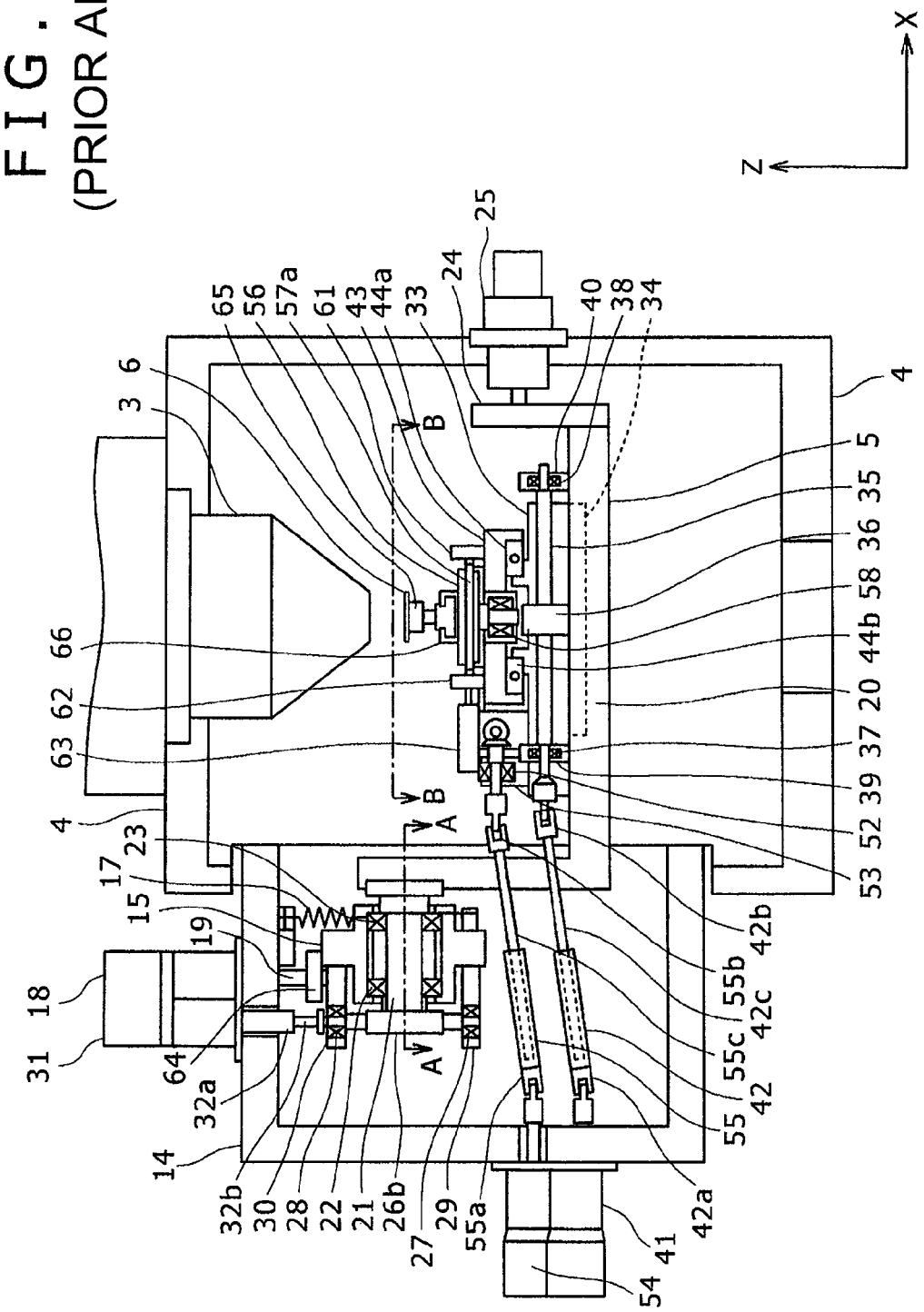
FIG. 2 is a configuration diagram showing an example of a sample-moving stage used in the conventional scanning electron microscope.
Figure 3:
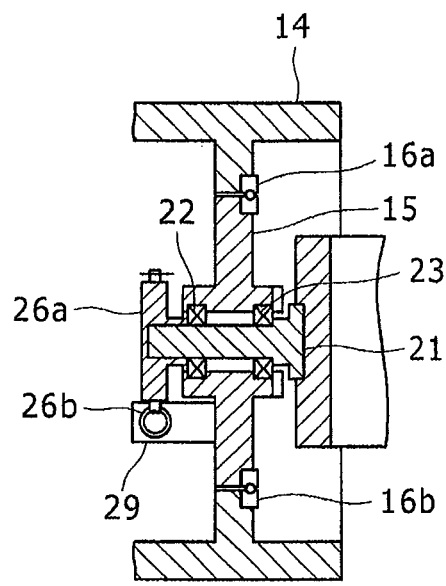
FIG. 3 is an external view taken along line A-A in FIG. 2.
Figure 4:
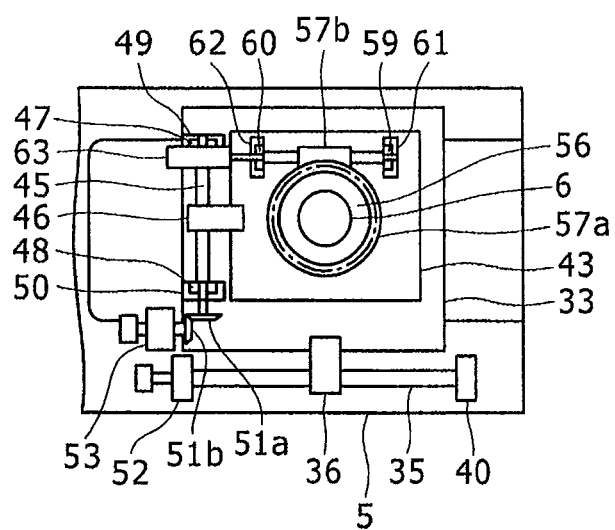
FIG. 4 is an external view taken along line B-B in FIG. 2.
Figure 5:
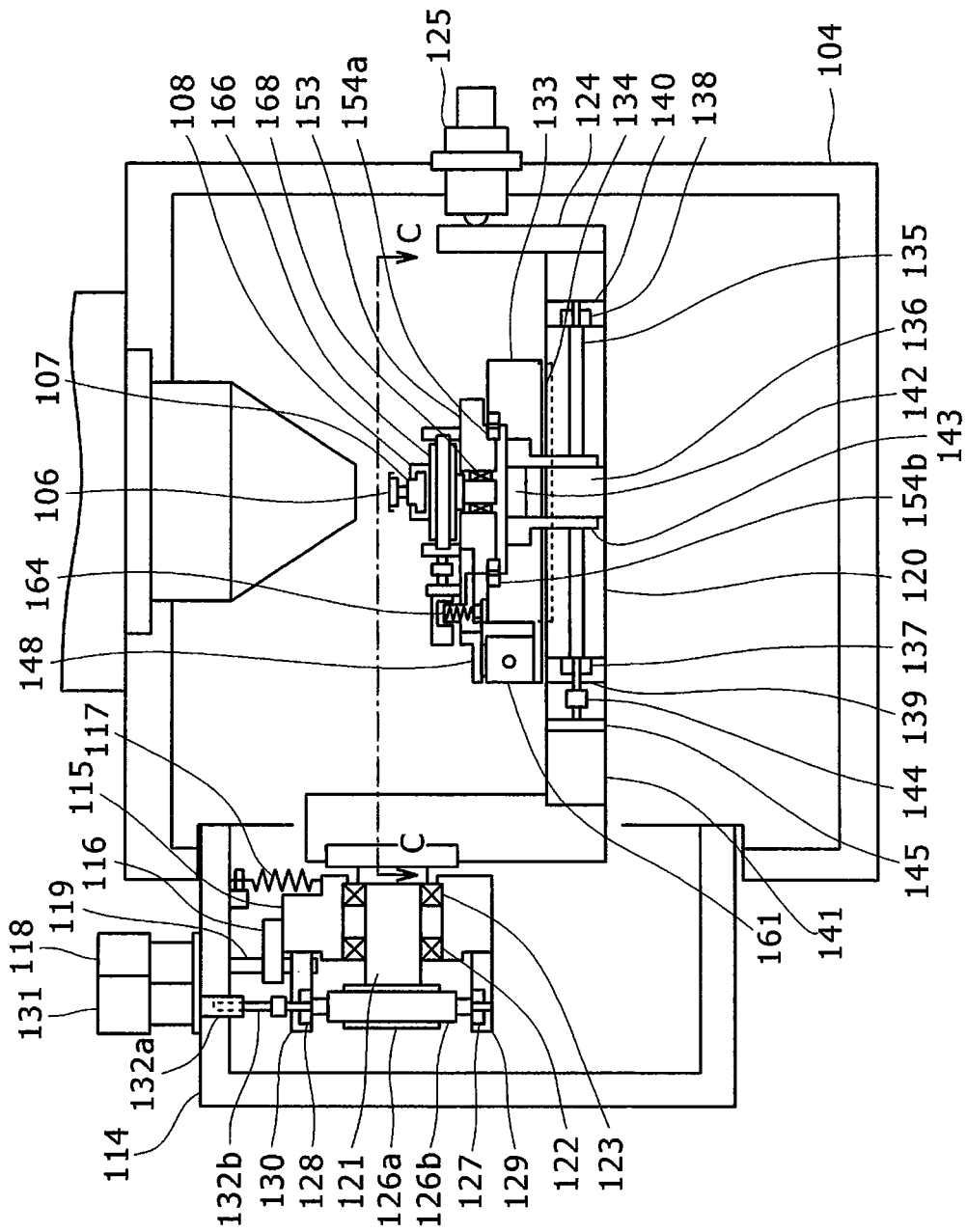
FIG. 5 is a configuration diagram showing a sample-moving stage used in a first embodiment of the present invention.
Figure 6:
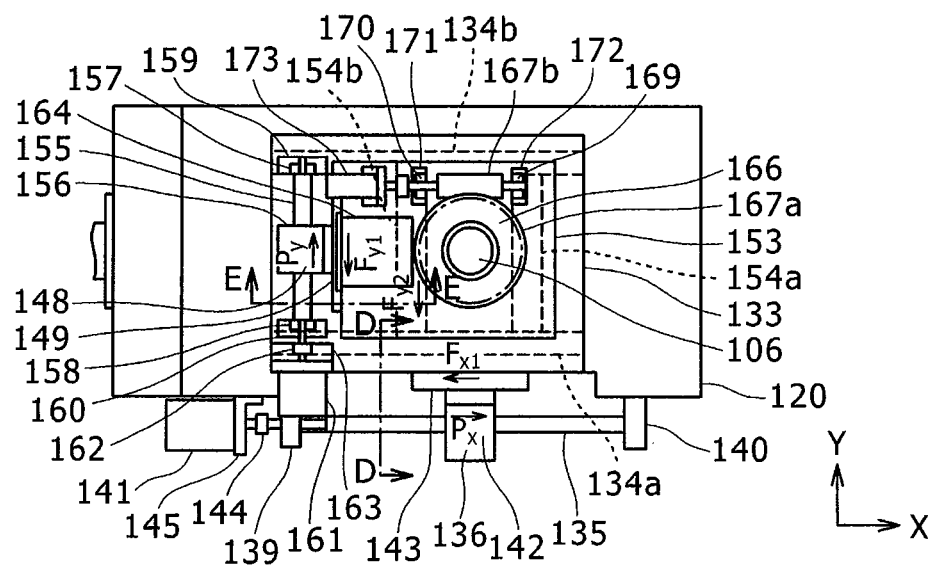
FIG. 6 is an external view taken along line C-C in FIG. 5.

The present invention is described below in accordance with an illustrated embodiment of the present invention. FIG. 5 shows the embodiment. FIG. 6 shows an external view taken along line C-C in FIG. 5. A stage casing 114 is connected to a sample chamber 104, and a z-table system and a tilting table driving system, both mounted in the stage casing 114, are basically the same as in prior art. A z-table 115 is coupled to the stage casing 114 via a cross roller bearing (not shown). The z-table 115 is pulled upward by a spring 117 and then driven by a z-stepping motor 118 to move a z-moving shaft 119 vertically and thus to be guided along the cross roller bearing and move in a z-direction. As a result, the z-table 115 moves a sample 106 in the z-direction. The z-moving shaft 119 is male-threaded, and the male-threaded section of the z-moving shaft 119 and a female-threaded section 116 of the z-table 115 work together to move the z-table 115 vertically.

A tilting shaft 121 is mounted at one end of a tilting table 120, and the tilting shaft 121 is pivotally coupled to the z-table 115 via roller bearings 122 and 123. A locking plate 124 is mounted at the other end of the tilting table 120 and pushed by a stage-locking mechanism 125 mounted in the sample chamber 104. A worm wheel 126a is fitted at an end of the tilting shaft 121, and a worm gear 126b formed to be combined with the worm wheel 126a is supported by ball bearings 127 and 128 and connected to the z-table 115 at bearing housings 129 and 130. The worm wheel 126a and a T-stepping motor 131 that rotates the worm gear 126b are coupled to each other by spline shafts 132a and 132b so as to be able to follow a movement of the z-table 115 in the z-direction. Rotation of the T-stepping motor 131 rotates the tilting shaft 121, thus tilts the sample 106, and retains the sample 106 at a fixed tilt angle. An x-table 133 that moves the sample 106 in an x-direction is mounted on the tilting table 120 via a cross roller guide 134.

The x-table 133 is driven by a feed action of an x-ball screw 135 and an x-ball screw nut 136. The x-ball screw nut 136 is fixed to the x-table 133 via an x-connector 142 and an x-slider 143. The x-ball screw 135 is supported at both ends thereof by ball bearings 137 and 138, and is connected to the tilting table 120 at bearing housings 139 and 140. The x-ball screw 135 is connected to an x-stepping motor 141 via an x-coupling 144, the x stepping motor 141 is supported by an x-bracket 145, and the x-bracket 145 is fixed to the tilting table 120. The x-table 133 drives the x-stepping motor 141 to rotate the x-ball screw 135 and feed the x-ball screw nut 136. This feed action moves the x-table 133 in the x-direction, hence moving the sample 106 in the x-direction.

A y-table 153 is mounted on the x-table 133 via cross roller guides 154a and 154b. The y-table 153 is driven by a feed action of a y-ball screw 155 and a y-ball screw nut 156. The y-ball screw nut 156 is fixed to the y-table 153 via a y-connector 148 and a y-ball screw base 149. The y-ball screw 155 is supported at both ends thereof by ball bearings 157 and 158, and is connected to the x-table 133 at bearing housings 159 and 160. The y-ball screw 155 is also connected to a y-stepping motor 161 via a y-coupling 162, the y-stepping motor 161 is supported by a y-bracket 163, and the y-bracket 163 is fixed to the x-table 133. The y-table 153 drives the y-stepping motor 161 to rotate the y-ball screw 155 and feed the y-ball screw nut 156. This feed action moves the y-table 153 in a y-direction, hence moving the sample 106 in the y-direction. A y-slider 164 is mounted on the y-table 153 so that the y-slider 164 faces the y-ball screw nut 156. A rotation table 166 has a worm wheel 167a and is pivotally coupled to the y-table 153 by a ball bearing 168.

A worm gear 167b is supported at both ends thereof by ball bearings 169 and 170, and is connected to the y-table 153 at bearing housings 171 and 172. The worm gear 167b is rotated by a DC motor 173. Rotation of the DC motor 173 turns the worm gear 167b and the worm wheel 167a, thus rotating the rotation table 166 and hence the sample 106. The sample 106 is mounted in bonded form on a sample holder 107, and the sample holder 107 is inserted in and fixed to a holder stage 108 mounted on the rotation table 166.

Figure 7:
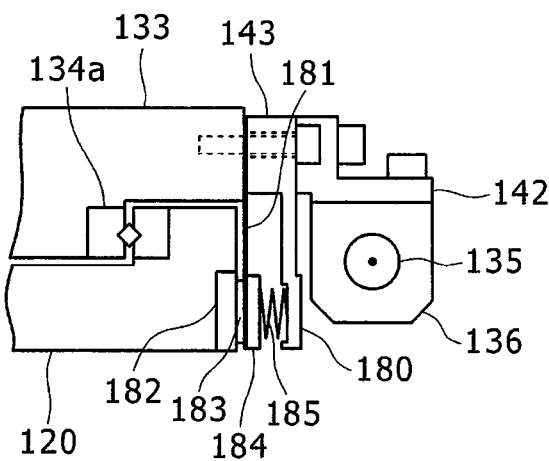
FIG. 7 is an external view taken along line D-D in FIG. 6, showing an example of an x-slider and periphery.
Figure 8:
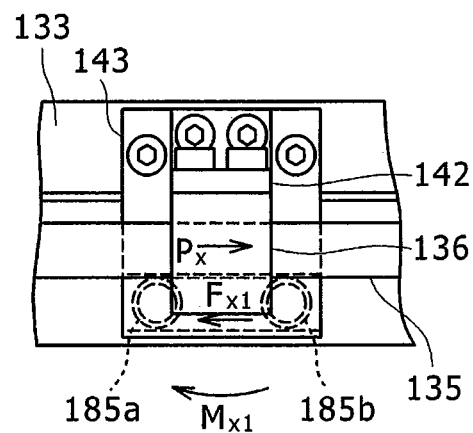
FIG. 8 is a side view of the x-slider and periphery shown in FIG. 7.
Figure 9:
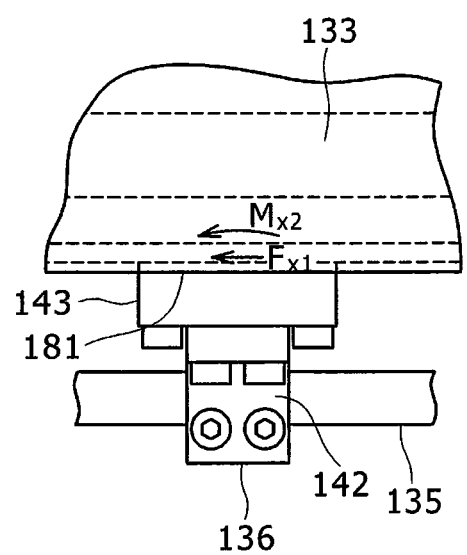
FIG. 9 is a plan view of the x-slider and periphery shown in FIG. 8.

FIG. 7 is an external view taken along line D-D in FIG. 6, showing an example of an x-slider and periphery. FIG. 8 is a side view of the x-slider and periphery shown in FIG. 7, and FIG. 9 is a plan view of the x-slider and periphery shown in FIG. 8. The x-slider 143 has an x-slider base 180 bolted down onto the x-table 133 with an x-leaf spring 181 interposed between the x-slider 143 and the x-table 133. The x-ball screw nut 136 of the x-ball screw 135 is fixed to the x-slider base 180 via the x-connector 142. An x-friction material 183 that slides with an x-mating plate 182 mounted on the tilting table 120 is bonded onto one surface of a front end of the x-leaf spring 181, and an x-spring locking washer plate 184 onto the other surface. Between the x-slider base 180 and the x-spring locking washer plate 184, an x-spring 185 is placed to impart a force that presses the x-friction material 183 against the x-mating plate 182. The x-spring 185 is a coil spring consisting of two members, 185a and 185b, mounted at both ends of the x-friction material 183. The x-friction material 183 is formed from a thin sheet of a polymeric material. The x-spring locking washer plate 184 is provided to maintain planarity of the x-friction material 183. The x-friction material 183 and the x-spring locking washer plate 184 are formed by bonding, so the x-slider 143 can be constructed into a thin structure. When the x-ball screw 135 drives the x-ball screw nut 136 and moves the x-table 133, the x-ball screw 135 and an x-cross roller guide 134a are in rolling frictional contact. Small friction coefficients of the x-ball screw 135 and the x-cross roller guide 134a, therefore, make these elements easy to move, and actually give instability to the movement of the x-table 133, that is, impart subtle unsteadiness or unsmoothness to the table movement as an image is being moved, and result in visibility decreasing when the image is observed at, in particular, a high magnification. The x-friction material 183 is pressed against the x-mating plate 182 of the tilting table 120 by the x-spring 185, thereby causing sliding friction between the x-friction material 183 and the x-mating plate 182, and thus preventing the destabilization. The sliding friction does not need to have a large value, because the x-friction material 183 only prevents the destabilization due to its nature of moving easily. Since the sliding friction between the x-friction material 183 and the x-mating plate 182 is small, torsional deformation of the driving system due to the sliding friction is minimized, which in turn minimizes a delay in the movement of the x-table 133 as it starts moving. It is easy to place the x-slider 143 on or at a surface of the x-table located at an opposite side of the x-ball screw 135, but although the x-slider 143 has small frictional force, placing the x-slider 143 at such a position means correspondingly distancing the x-slider itself from the x-ball screw 135 and increasing a moment generated by the friction force within the plane parallel to that along which the x-table 133 moves. This increase in moment causes bending deformation to the ball screw 135, consequently deforming the roller of the cross roller guide 134, and delaying the movement of the x-table 133 as it starts moving. While the deformation of the ball screw 135 and the cross roller guide 134 would be insignificant, the deformation will appear in the operations performed when the image is moved under a high magnification. That is to say, even when the x-stepping motor 141 is rotated by turning the ball of the trackball to rotate the ball screw 135, the deformation of the ball screw 135 and the cross roller guide 134 will cause the x-table 135 to remain inactive for a certain time as it starts moving. The same event will also occur when the table starts to move in a reverse direction. Subtle positioning at the high magnification will therefore be difficult.

In the present embodiment, the x-slider 143 is disposed in close vicinity of the x-ball screw 135 and formed thinly, which reduces the moment $M_{x1}$ generated by the frictional force $F_{x1}$ of the x-slider 143, renders the ball screw 135 and the like less prone to deformation, and consequentially suppresses the delay in the movement of the x-table 133 as it starts moving. Length of the x-leaf spring 181 in a sliding direction is set to be at least twice that of the x-leaf spring 181 in a direction right-angled to the sliding direction, and the x-leaf spring 181 minimizes deformation of the x-leaf spring 181 due to the moment $M_{x1}$ generated in the plane parallel to the sheet of FIG. 8. These characteristics suppress the delay in the start of movement of the x-table 133 due to the deformation of the x-leaf spring 181.

Reference symbol $P_x$ denotes a driving force exerted upon the x-table 133 by the x-ball screw 135 and the x-ball screw nut 136. Length of the x-friction material 183 in a sliding direction is set to be at least twice that of the x-friction material 183 in a direction right-angled to the sliding direction, and the x-friction material 183 minimizes the instability of contact between the x-friction material 183 and the x-mating plate 182 due to a moment $M_{x2}$ generated in a plane parallel to the sheet of FIG. 9. Additionally, thinness of the x-friction material 183 reduces $M_{x2}$, minimizes deformation of the x-leaf spring 181 due to $M_{x2}$, and suppresses the instability of the friction between the x-friction material 183 and the x-mating plate. In this way, the instability of contact friction due to the ease of movement of the x-friction material is prevented by the assignment of sliding friction to the x-slider 143, and the instability of, as well as the delay in, the movement of the x-table 133 as it starts moving, due to the interposition of the x-slider 143 between the x-table 133 and the x-ball screw 135, is minimized by thinning the x-slider 143 and disposing it in close proximity to the ball screw 135.

Figure 10:
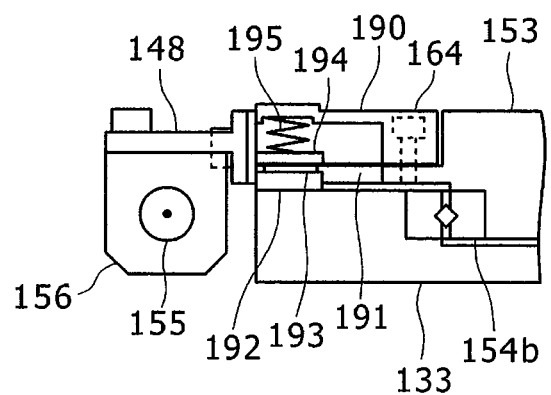
FIG. 10 is an external view taken along line E-E in FIG. 6, showing another example of a y-slider and periphery.
Figure 11:
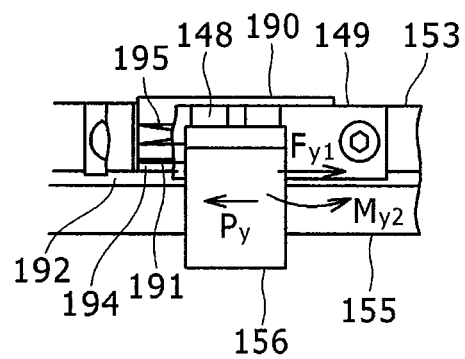
FIG. 11 is a side view of the y-slider and periphery shown in FIG. 10.
Figure 12:
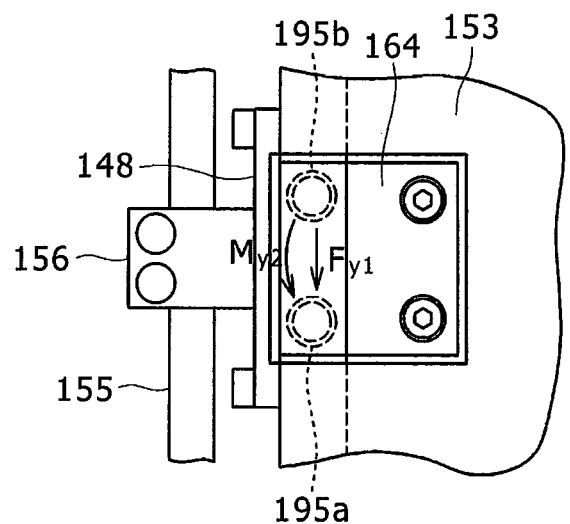
FIG. 12 is a plan view of the y-slider and periphery shown in FIG. 10.

FIG. 10 is an external view taken along line E-E in FIG. 6, showing an example of a y-slider and periphery. FIG. 11 is a side view of the y-slider and periphery shown in FIG. 10, and FIG. 12 is a plan view of the y-slider and periphery shown in FIG. 10. Although the x-slider 143 is disposed vertically, the y-slider 164 is disposed horizontally since the y-table 153 is too thin to accept vertical placement of the y-slider 164. A y-slider base 190 is bolted down onto the y-table 153 with a y-leaf spring 191 interposed between the y-slider 164 and the y-table 153. The y-ball screw nut 156 of the y-ball screw 155 is fixed to the y-table 153 via the y-connector 148. A y-friction material 193 that slides with a y-mating plate 192 mounted on the x-table 133 is bonded onto one surface of a front end of the y-leaf spring 191, and a y-spring locking washer plate 194 onto the other surface. The y-friction material 193 is formed from a thin sheet of a polymeric material. Between the y-slider base 190 and the y-spring locking washer plate 194, a y-spring 195 is placed to impart a force that presses the y-friction material 193 against the y-mating plate 192. The y-spring 195 is a coil spring consisting of two pieces, 195a and 195b, mounted at both ends of the y-friction material 193. The y-spring locking washer plate 194 is provided to maintain planarity of the y-friction material 193. When the y-ball screw 155 drives the y-ball screw nut 156 and moves the y-table 153, the y-ball screw 155 and y-cross roller guides 154a and 154b are in rolling frictional contact. Small friction coefficients of the y-ball screw 155 and the y-cross roller guides 154a, 154b, therefore, make these elements easy to move, and actually give instability to the movement of the y-table 153. The y-slider removes the instability. Functions and advantageous effects of the y-slider 164 are the same as those of the x-slider 143. In addition, the y-leaf spring 191, as with the x-leaf spring 181, is at least twice as long in a sliding direction as in a direction right-angled to the sliding direction, and the y-friction material 193, as with the x-friction material 183, is at least twice as long in a sliding direction as in a direction right-angled to the sliding direction. The relationship between $F_{x1}$ and $M_{x1}$, $M_{x2}$, on the x-table 133, therefore, is the same as that of $F_{y1}$ and $M_{y1}$, $M_{y2}$, on the y-table 153.

Figure 13:
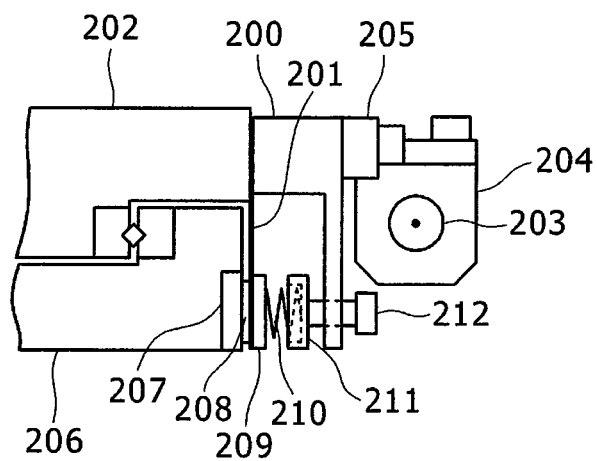
FIG. 13 is an external view of a frictional force adjusting slider.

FIG. 13 is an external view of a frictional force adjusting slider and periphery assuming that a coefficient of friction between a frictional material and a mating plate varies with time, the slider and periphery being designed to give continued appropriate stability to movements of tables by adjusting frictional force. The following describes an x-table. An x-slider base 200 is bolted down onto the x-table 202 with an x-leaf spring 201 interposed between the x-slider base 200 and the x-table 202. An x-ball screw nut 204 of an x-ball screw 203 is fixed to the x-slider base 200 via an x-connector 205. An x-friction material 208 that slides with an x-mating plate 207 mounted on a tilting table 206 is bonded onto one surface of a front end of the x-leaf spring 201, and a spring locking washer plate 209 onto the other surface. The x-spring locking washer plate 209 is provided to maintain planarity of the x-friction material 208. An x-spring 210 is interposed between the x-slider base 200 and the x-spring locking washer plate 209, so that pushing an x-spring locking washer 211 from the slider base 200 by rotating an adjusting screw 212 presses the x-sliding material 208 against the x-mating plate 207. The pressure applied at this time will be adjusted according to the amount of rotation of the adjusting screw 212.

DESCRIPTION OF REFERENCE NUMBERS

1 Electron gun
3 Objective lens
4 Sample chamber
5 Sample-moving stage
6, 106 Sample
14, 114 Stage casings
15 z-table
16a, 16b Cross roller guides
18 z-stepping motor
19 z-moving shaft
20, 120 Tilting tables
21 Tilting shaft
22, 23 Roller bearings
26a Worm wheel
26b Worm gear
31 T-stepping motor
32a, 32b Spline shafts
33, 133 x-tables
41, 141 x-stepping motors
42 x-stage joint
43, 153 y-tables
54, 161 y-stepping motors
55 y-stage joint
56, 166 Rotation tables
63, 173 DC motors
135 x-ball screw
143 x-slider
155 y-ball screw
164 y-slider
180 x-slider base
181 x-leaf spring
182 x-mating plate
183 x-friction material
190 y-slider base
191 y-leaf spring
192 y-mating plate
193 y-friction material

The invention claimed is:

1. A scanning electron microscope in which a sample-moving stage for moving a sample includes an x-table for moving the sample in an x-direction right-angled to an electron beam, a y-table for moving the sample in a y-direction right-angled to the x-direction as well as to the electron beam, the y-table being mounted above the x-table, a z-table configured to move in a same z-direction as the direction in which the electron beam travels, a rotation table for rotating the sample in a plane parallel to an x-y plane, and a tilting table for imparting a tilting action to the sample,
   the x-table being mounted on the tilting table,
   the x-table and the y-table being guided by respective rolling friction elements, and moved by respective stepping motors disposed in a sample chamber, each of the motors being connected to a ball screw via a coupling,
   the electron beam being scanned on the sample surface, thereby allowing a detector to detect a signal originating from the sample, and
   the signal detected by the detector being used to display an image of the sample,
   wherein between the tilting table and the x-table as well as between the x-table and the y-table, a sliding friction element is disposed at the same side as the side at which the ball screw is located with respect to the sample, and
   wherein each sliding friction element is fixed at one end of its slider base to one of two tables or bases configured to move in relative form, with a leaf spring interposed at one end thereof between the sliding friction element and the table or the base, the sliding friction element being inclusive of, in addition to the friction material, which is bonded onto one surface of the other end of the leaf spring in such a form as to face the mating plate, which is connected to the other table or base, a spring locking washer plate bonded onto the other surface, and
   wherein between the slider base and the spring locking washer plate, at least one coil spring is placed to press the friction material against the mating plate.

2. The scanning electron microscope according to claim 1, wherein:
   the sliding friction element between the x-table and the tilting table is disposed in a longitudinal direction, and the sliding friction element between the y-table and the x-table is disposed in a lateral direction.

3. The scanning electron microscope according to claim 1, wherein:
the leaf spring and the friction material are both at least twice as long in the moving direction of the table as in the direction right-angled to the moving direction.

4. The scanning electron microscope according to claim 1, wherein:
the ball screw for driving the table includes a nut mounted on the sliding friction element via a coupling.

5. The scanning electron microscope according to claim 1, wherein:
the sliding friction element between the x-table and the tilting table is disposed in a longitudinal direction, and the sliding friction element between the y-table and the x-table is disposed in a lateral direction.

6. The scanning electron microscope according to claim 1, wherein:
the rolling friction elements are cross roller guides.

* * * * *